United States Patent [19]

Lage

[11] Patent Number: 5,422,296
[45] Date of Patent: Jun. 6, 1995

[54] PROCESS FOR FORMING A STATIC-RANDOM-ACCESS MEMORY CELL

[75] Inventor: Craig S. Lage, Austin, Tex.

[73] Assignee: Motorola, Inc., Schaumburg, Ill.

[21] Appl. No.: 232,968

[22] Filed: Apr. 25, 1994

[51] Int. Cl.⁶ ............................................. H01L 21/70
[52] U.S. Cl. ...................................... 437/52; 437/56; 437/57; 437/89; 437/203
[58] Field of Search ...................... 437/48, 52, 56, 57, 437/89, 203; 257/330, 332, 393, 903

[56] References Cited

U.S. PATENT DOCUMENTS

| | | | |
|---|---|---|---|
| 4,987,090 | 1/1991 | Hsu et al. | 437/52 |
| 5,082,795 | 1/1992 | Temple | 437/41 |
| 5,256,588 | 10/1993 | Witek et al. | 437/203 |
| 5,285,093 | 2/1994 | Lage et al. | 257/332 |
| 5,364,810 | 11/1994 | Kosa et al. | 437/203 |

OTHER PUBLICATIONS

Wolf; Silicon Processing for the VLSI ERA; vol. 2; pp. 72–75 (1990).
Eklund, et al.; "A 0.5 μ, BiCMOS Technology for Logic and 4 Mbit-class SRAM's," IEDM: pp. 425–428 (1989).

Primary Examiner—Tom Thomas

[57] ABSTRACT

An SRAM cell includes a pair of cross-coupled inverters where each inverter includes vertical n-channel and p-channel transistors having a gate electrode that is shared between the transistors that make up each inverter. The gate electrodes for the inverters laterally surround the channel regions of the p-channel load transistors to achieve a relatively high beta ratio without occupying a large amount of substrate surface area. Also, the gate electrodes increase the amount of capacitance of the storage nodes and decreases the soft error rate. The active regions of the latch transistors are electrically isolated from the substrate by a buried oxide layer, thereby decreasing the chances of latch-up.

15 Claims, 5 Drawing Sheets

PROCESS FOR FORMING A STATIC-RANDOM-ACCESS MEMORY CELL

FIELD OF THE INVENTION

This invention relates in general to semiconductor devices, and more particularly to semiconductor devices having trench structures.

BACKGROUND OF THE INVENTION

FIG. 1 includes a circuit diagram of a six-transistor static-random-access memory (SRAM) cell 300 that includes two access transistors 311 and 321, two latch transistors 312 and 322, and two load transistors 313 and 323. The access transistors 311 and 321 have first source/drain regions that are coupled to a bit line signal (BL) and a complementary bit line signal ($\overline{BL}$), respectively. Source regions of the latch transistors 312 and 322 are coupled to $V_{SS}$, and source regions of the load transistors are coupled to $V_{DD}$. The SRAM cell 300 further includes a word line 301 coupled to the gate electrodes of the access transistors 311 and 321. A second source/drain region of the access transistor 311 and drain regions of the latch and load transistors 312 and 313 are electrically connected to one another to form a first storage node 310. A second source/drain region of the access transistor 321 and drain regions of the latch and load transistors 322 and 323 are electrically connected to one another to form a second storage node 320. The gate electrodes for the latch and load electrodes 312 and 313 are coupled to the second storage node 320, and the gate electrodes for the latch and load electrodes 322 and 323 are coupled to the first storage node 310. The pass and latch transistors 311, 321, 312, 322 are n-channel transistors, and the load transistors 313 and 323 are p-channel transistors.

As semiconductor devices become smaller, it becomes necessary to arrange individual components within a device such that minimal separation distances are achieved. The need to design compact component arrangements occurs most significantly in memory devices. Because of the large number of components needed to fabricate a typical dynamic-random-access-memory (DRAM) device or typical SRAM device, the components must be arranged compactly if the overall device dimensions are not to become excessively large. This problem is especially critical in SRAM devices where a typical individual memory cell contains as many as six separate components.

One technique for reducing memory cell dimensions is to place a number of the components in a trench structure, which is sunk into the substrate. More specifically, a toroidal shared-gate SRAM cell may be formed. The SRAM cell includes vertical latch and load transistors that have active regions that lie along or within trenches. With respect to the latch transistors of the SRAM cell, the drain regions lie adjacent to the top of the trench, and the source regions lie adjacent to the bottom of the trench. The source regions are heavily n-type doped and are electrically isolated underneath by a lightly p-type doped layer. The combination of the active regions of the latch transistors and the lightly p-type doped layer forms an npnp structure and may be biased under certain conditions in such a way as to cause a latch-up condition to occur and is undesired.

SUMMARY OF THE INVENTION

The present invention includes a static-random-access memory cell. The semiconductor device comprises a semiconductor substrate, a buried oxide layer, a first layer, a second layer, a trench, a first doped region, a third layer, a second doped region, a dielectric layer, and a first conductive member. The semiconductor substrate has a first conductivity type. The buried oxide layer overlies the substrate, and the first layer overlies the buried oxide layer. The first layer has a second conductivity type that is opposite the first conductivity type. The second layer overlies the first layer and has the first conductivity type. The trench extends through the buried oxide, first, and second layers and has a wall surface, a bottom surface, and a central region. A channel region of a first transistor lies within the second layer along the wall of the trench. The first doped region has the second conductivity type and lies within the second layer and adjacent to the wall surface. The third layer overlies the substrate within the central region of the trench, has the second conductivity type, and has a wall surface that faces the wall surface of the trench. The channel region of a second transistor lies within the second layer along the wall of the trench. The second doped region lies within the third layer and has the first conductivity type. The first gate dielectric layer lies along the wall surfaces of the trench and third layer and along the bottom of the trench outside of the central region. The first conductive member lies at least partially within the trench and adjacent to the first gate dielectric layer, laterally surrounds the third layer, and acts as a shared-gate electrode for the first and second transistors. The present invention also includes processes for forming the static-access-memory cell.

Other features and advantages of the present invention will be apparent from the accompanying drawings and from the detailed description that follows.

BRIEF DESCRIPTION OF THE DRAWINGS

The present invention is illustrated by way of example and not limitation in the FIGS. of the accompanying drawings, in which like references indicate similar elements, and in which.

DETAILED DESCRIPTION OF EMBODIMENTS

In the embodiments described below, a six transistor SRAM cell is formed having two n-channel vertical field-effect transistors and two p-channel field-effect transistors. The SRAM cell includes a pair of cross-coupled inverters wherein each inverter includes one of the n-channel transistors and one of the p-channel transistors. The n-channel vertical transistors overlies a buried oxide layer, and the n-channel and p-channel vertical transistors of each inverter have a shared-gate electrode that surrounds the active region of the p-channel transistor for that inverter. The present invention is better understood with the embodiments described below. Before describing embodiments of the present invention, a vertical field-effect transistor is defined. A vertical field-effect transistor is a transistor in which the flow of electrons or holes is primarily in a vertical direction (perpendicular to the primary surface of the substrate). For example, a drain region of the vertical transistor overlies a source region of the vertical transistor and is separated by a channel region of the transistor. The location of the drain and source regions may be reversed.

SRAM Cell

Figure 1:
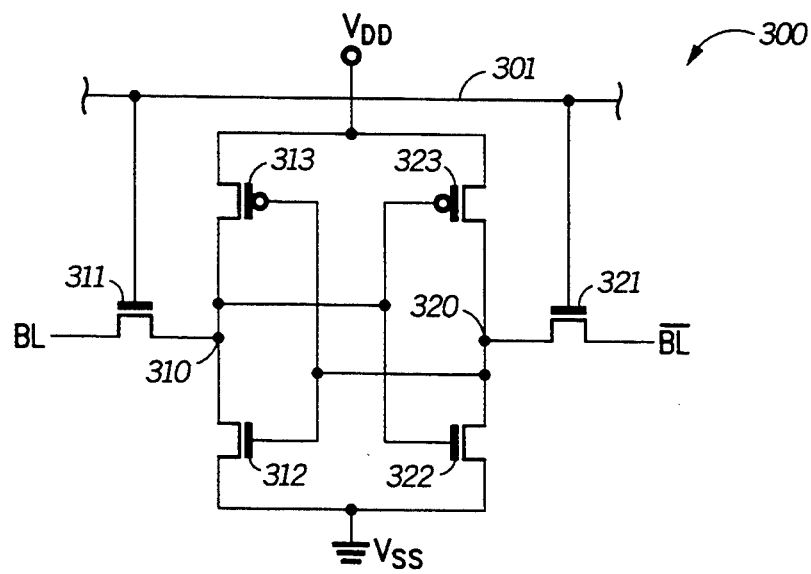
FIG. 1 includes a circuit diagram of a six transistor SRAM cell. (Prior art)
Figure 2:
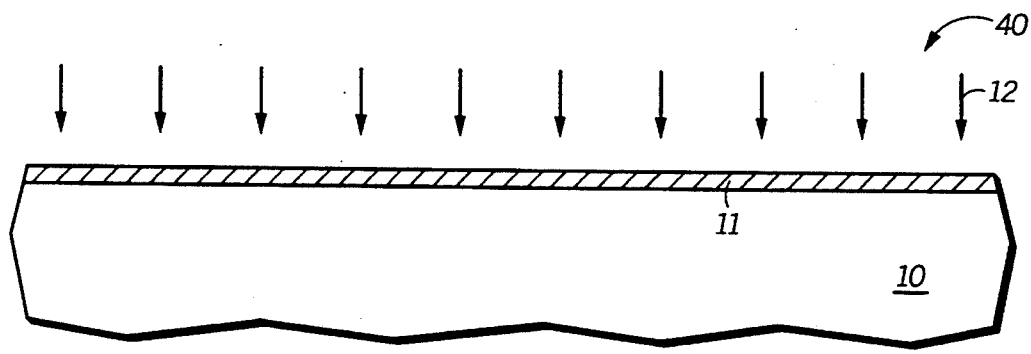
FIG. 2 includes a cross-sectional view of a portion of a semiconductor substrate being implanted with oxygen ions.
Figure 3:
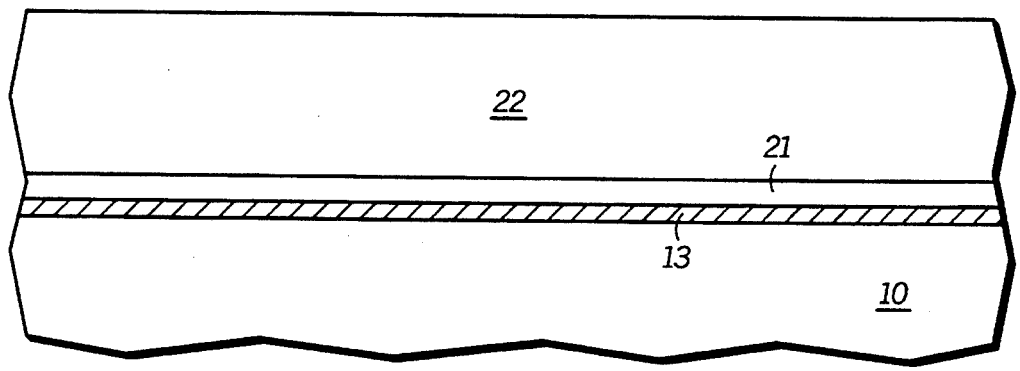
FIG. 3 includes a cross-sectional view of the substrate of FIG. 2 after forming an N+ doped buried layer, and a p-type epitaxial layer.

FIG. 2 includes a cross-sectional view of a portion of a semiconductor substrate 10 where a six transistor SRAM cell 40 is subsequently formed. The substrate 10 includes a monocrystalline silicon material having a p-type dopant with a dopant concentration in a range of about 1E17 to 1E18 atoms per cubic centimeter. The substrate 10 is ion implanted with oxygen ions (shown by arrows 12) to a dose of at least 1E17 ions per square centimeter at an energy in a range of about 150–180 kiloelectron volts to form an implanted zone 11. During the ion implant, the substrate 10 is typically heated to at least 400 degrees Celsius, and usually in a range of about 600–650 degrees Celsius to help maintain the crystallinity of the substrate 10. The substrate is annealed at a temperature in a range of 1000–1200 degrees Celsius for a time in a range of 2–5 hours in an ambient including an inert gas to form a buried oxide layer 13 as shown in FIG. 3. The buried oxide layer 13 lies at least 1000 angstroms below the primary surface of the substrate upon formation of the buried oxide layer 13 and has a thickness of at least 1000 angstroms.

Figure 4:
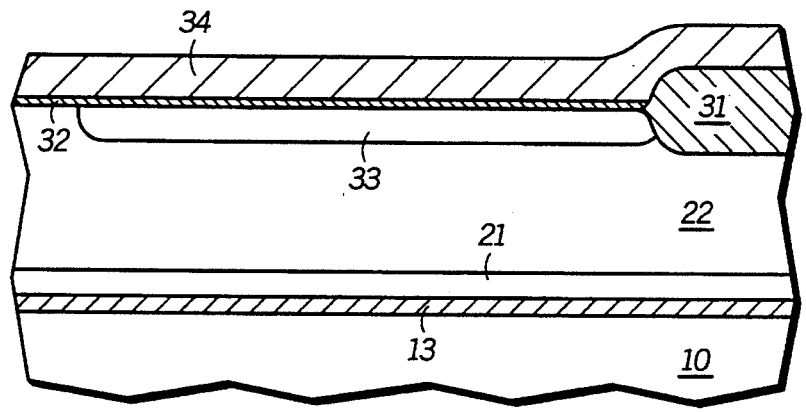
FIG. 4 includes a cross-sectional view of the substrate of FIG. 3 after forming a field isolation region, an N+ doped region, an oxide layer, and a silicon nitride layer.

The monocrystalline silicon region overlying the buried oxide is then doped with arsenic to convert this region to an N+ doped region 21 as shown in FIG. 3. A lightly-doped, p-type epitaxial layer 22 is grown over the N+ doped region 21 also shown in FIG. 3. The p-type epitaxial layer 22 is about 10,000 angstroms thick, is doped with a p-type dopant, such as boron and like, and has a doping concentration of about 1E17 atoms per cubic centimeter. Instead of forming these layers, substrates may be obtained from a vendor with a semiconductor base layer that is similar in composition to the semiconductor substrate 10, buried oxide layer 13, N+ doped region 21, and p-type epitaxial layer 22 already formed. The vendor-obtained substrates would be virtually identical to what is illustrated in FIG. 4. In other words, one skilled in the art has a choice of forming the buried oxide layer 13, N+ doped region 21 and p-type epitaxial layer 22 over the semiconductor substrate 10 or obtaining substrates from a vendor, wherein the substrate includes a semiconductor base layer, the buried oxide layer 13, the N+ doped region, and the p-type epitaxial layer 22.

A field isolation region 31 is formed from a portion of the p-type epitaxial layer 22 as shown in FIG. 4. The p-type epitaxial layer 22 is selectively doped with arsenic to form an N+ doped region 33 that is about 2000 angstroms thick. A silicon dioxide layer 32 about 200 angstroms thick is formed over the p-type epitaxial layer 22, and a silicon nitride layer 34 about 4000 angstroms thick is deposited over the entire surface.

Figure 5:
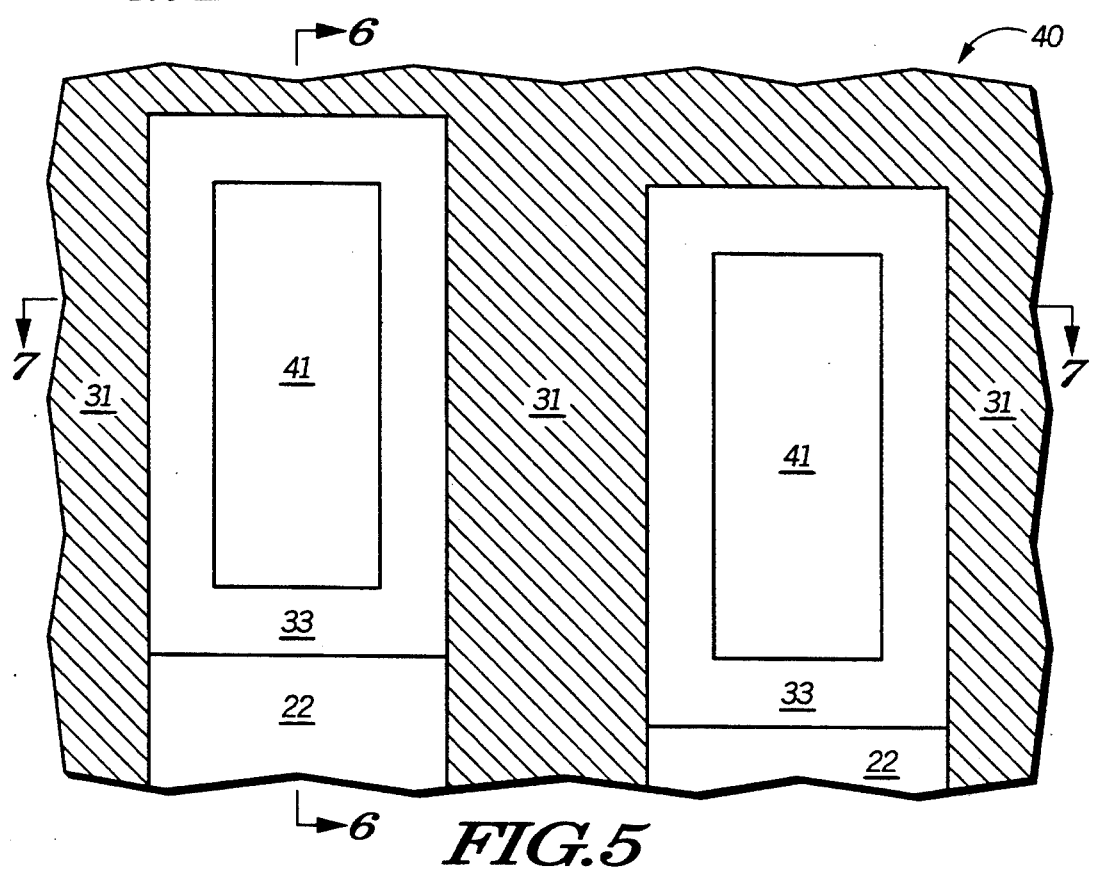
FIG. 5 includes a top view of the substrate of FIG. 4 after forming a trench.
Figure 6:
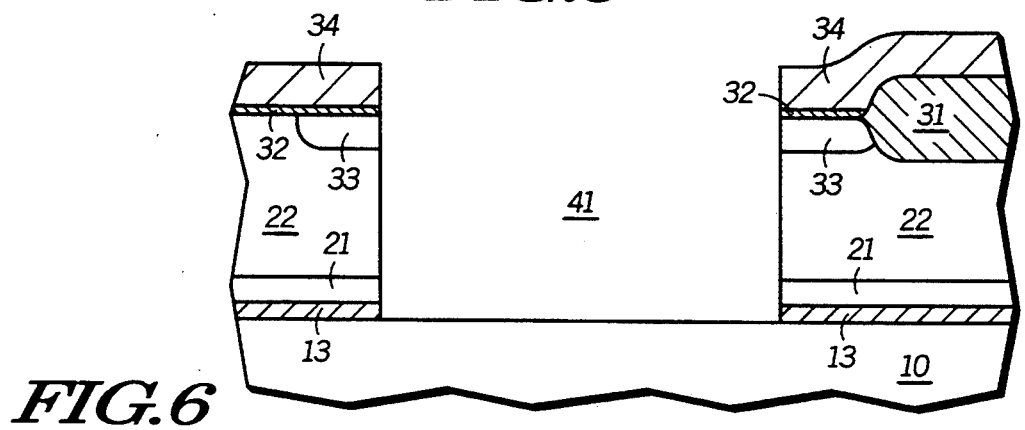
FIGS. 6 and 7 include cross-sectional view of the substrate of FIG. 5 as indicated by the sectioning lines in FIG. 5.
Figure 7:
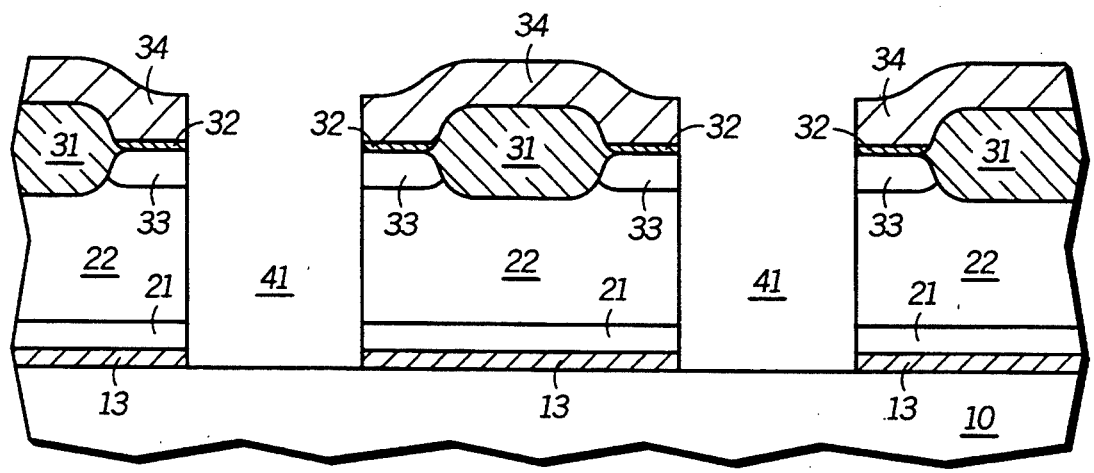

Referring to FIG. 5, trenches 41 are then etched through the silicon nitride layer 34, silicon dioxide layer 32, silicon (33, 22, and 21), and buried oxide layer 13. The etch is stopped on or in the substrate 10. The trenches 41 have bottom and wall surfaces and are laterally surrounded by the N+ doped region 33 near the tops of the trenches 41, as shown in FIG. 5. FIGS. 6 and 7 include cross-sectional views after the trenches are etched, as indicated by the sectioning lines in FIG. 5. Usually, the trench is etched in a sequence of distinct steps. First, a fluorine-based chemistry is used to etch the silicon nitride layer 34 and the silicon dioxide layer 32, stopping on the N+ doped region 33. Next, a chlorine-based chemistry is used to etch the silicon layers (33, 22, and 21), stopping on the buried oxide layer 13. Finally, a fluorine-based chemistry is used to etch the buried oxide 13, stopping on or in the silicon substrate 10. Although the steps are distinct and are typically performed in different etchers, all of the etching steps that form the trenches 41 may be performed in one etcher.

Figure 8:
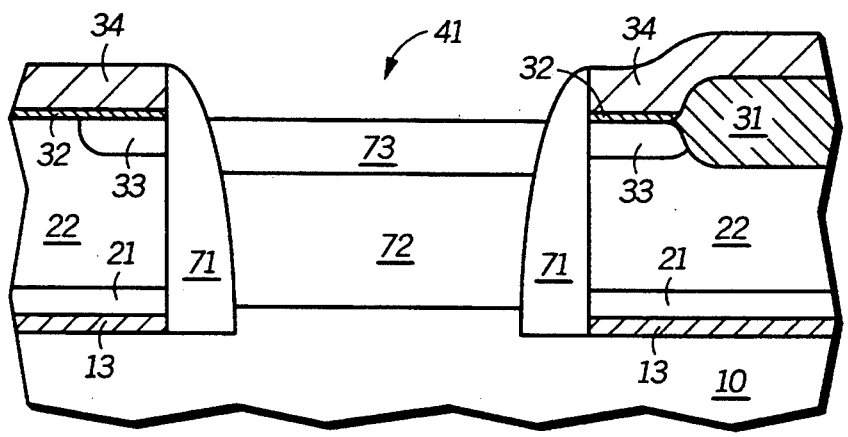
FIG. 8 includes a cross-sectional view of the substrate of FIG. 6 after forming sidewall spacers, an n-type epitaxial layer, and a P+ doped region within the n-type epitaxial layer.

Referring to FIG. 8, silicon dioxide spacers 71 are formed in the trenches by depositing a silicon dioxide layer to a thickness of about 1000 angstroms and then removing portions of the silicon dioxide layer using an anisotropic etch. The portions of the silicon dioxide layer lying along the walls of the trenches 41 are not etched and form the spacers 71. An n-type epitaxial layer 72 is selectively grown from the bottom surface within a central region (spaced apart from the wall surfaces) of the trenches 41 until the surface of the n-type epitaxial layer 72 is about the same elevation as the top of the N+ doped region 33. The lightly-doped, n-type epitaxial layer 72 is doped during growth to a concentration of about 1E17 atoms per cubic centimeter. The n-type epitaxial layer 72 grows only on exposed silicon surfaces and is performed by controlling the growth conditions in a manner familiar to one skilled in the art. After the formation of the n-type epitaxial layer 72, a P+ doped region 73 is formed adjacent to the surface of the n-type epitaxial layer 72 typically by ion implantation with a p-type dopant to a dose of about 1E15 ions per square centimeter. Region 73 forms the drain of the P-channel load transistors formed within the trench.

Figure 9:
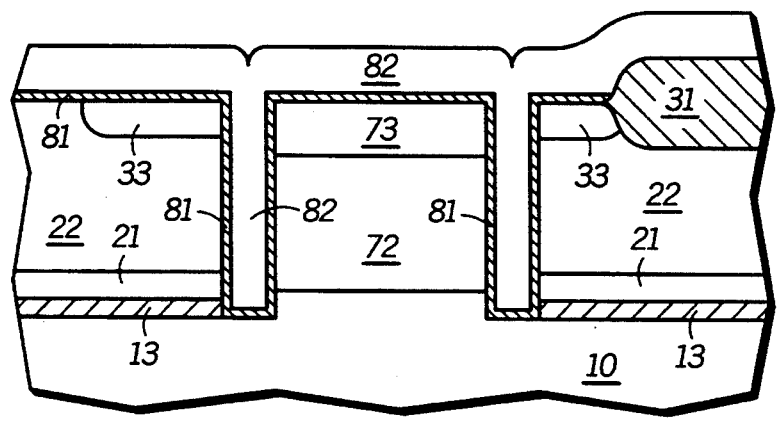
FIG. 9 includes a cross-sectional view of the substrate of FIG. 8 after forming a gate dielectric layer, and a first conductive layer.

The spacers 71 are removed, typically using a wet etch including a fluorine-containing solution, such as hydrofluoric acid. The silicon nitride layer 34 is then removed using a wet etch including phosphoric acid, and the silicon dioxide layer 32 is removed, again using a wet etch including a fluorine-containing solution. At this point, wall surfaces of the n-type epitaxial layer 72 are exposed and face the wall surfaces of the trenches 41. A gate dielectric layer 81 about 100 angstroms thick is then formed along the exposed silicon surfaces as shown in FIG. 9. Next, a first conductive layer 82 is deposited over the gate dielectric layer 81, field isolation region 31, and within portions of the trenches 41. Typically, the conductive layer 82 is formed by depositing polysilicon which is in-situ doped with phosphorous to a doping concentration exceeding 1E20 phosphorous atoms per cubic centimeter. Within the trenches 41, the first conductive layer 82 laterally surrounds the n-type epitaxial layer 72.

Figure 10:
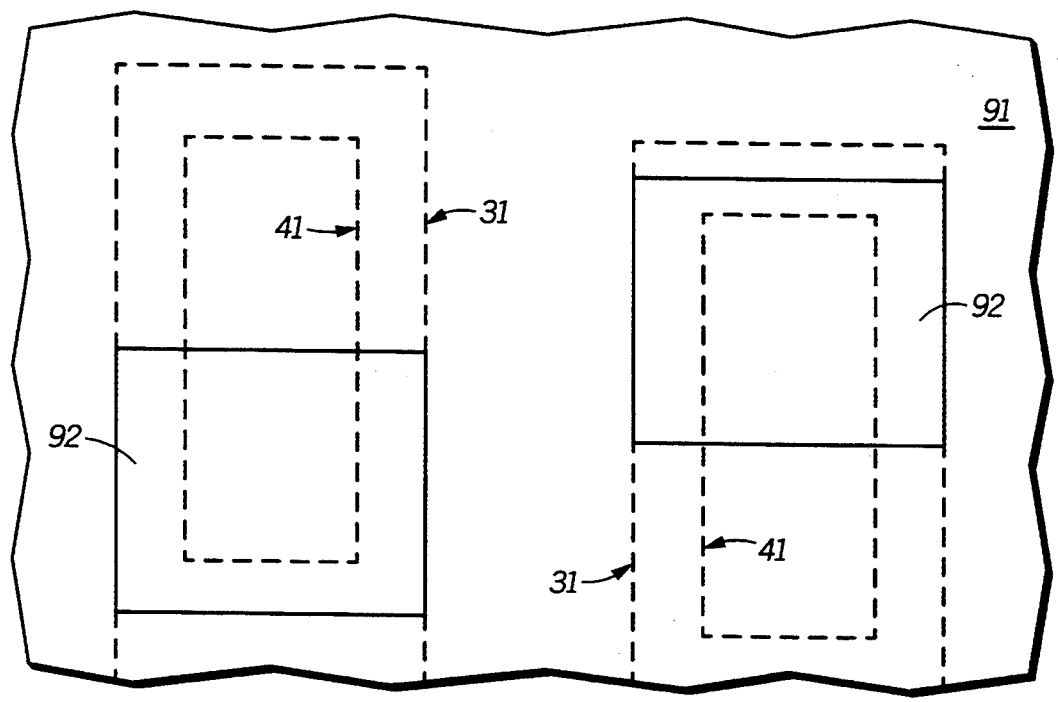
FIG. 10 includes a top view of the substrate of FIG. 9 after forming a masking layer, and openings within the masking layer.

The next step is to form contacts to drain regions 33 and 73 of the NMOS and PMOS transistors, respectively. FIG. 10 includes an illustration of a masking layer 91 through which contact openings 92 are formed. In FIG. 10, the dashed lines indicate the locations of the field isolation region 31 edge and the edges of the trenches 41.

Figure 11:
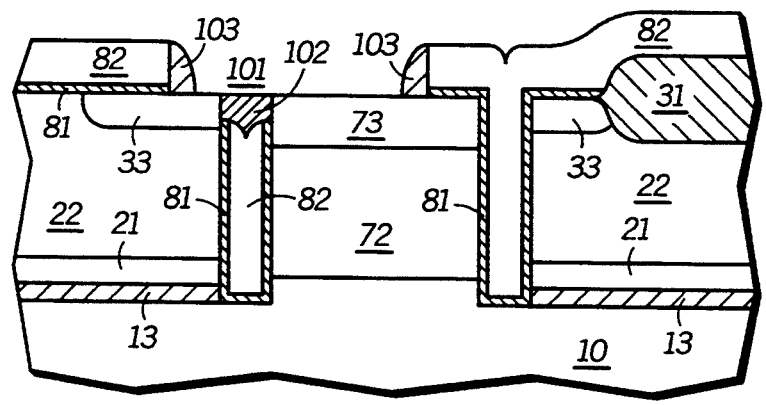
FIG. 11 includes a cross-sectional view of the substrate of FIG. 10 after patterning portions of the gate dielectric and first conductive layer, and forming sidewall spacers.

Using the masking layer 91 shown in FIG. 10, exposed portions of the conductive layer 82 are etched, typically using a chlorine-based chemistry under conditions, such that the gate dielectric layer 81 is not appreciably etched. After the exposed portions of the conductive layer 82 overlying regions 33 and 73 have been completely removed, the etch is continued in order to recess the conductive layer 82 below the surface by about 1000 angstroms, and form a recessed region 101 as shown in FIG. 11. Next, the exposed gate oxide 81 is removed, preferably using a fluorine-based chemistry which stops on the silicon regions 33 and 73 that underlie openings 92. Masking layer 91 is then removed. Next, a layer of silicon dioxide is deposited to a thickness of about 800 angstroms, then anisotropically etched to form spacers 103 and to fill recessed regions 101 with insulating silicon dioxide plugs 102.

Figure 12:
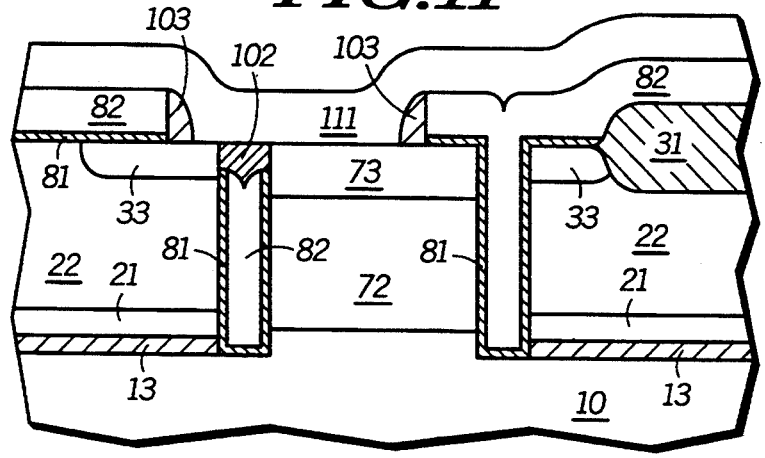
FIG. 12 includes a cross-sectional view of the substrate of FIG. 11 after forming a second conductive layer.

A second conductive layer 111 is then deposited over the first conductive layer 82, spacers 103, portions of regions 33 and 73, and over insulating plugs 102 as shown in FIG. 12. The second conductive layer 111 is typically a metal-containing layer, such as tungsten silicide and the like, and can make ohmic contacts to N+ doped regions 33, P+ doped regions 73, and the first conductive layer 82.

Figure 13:
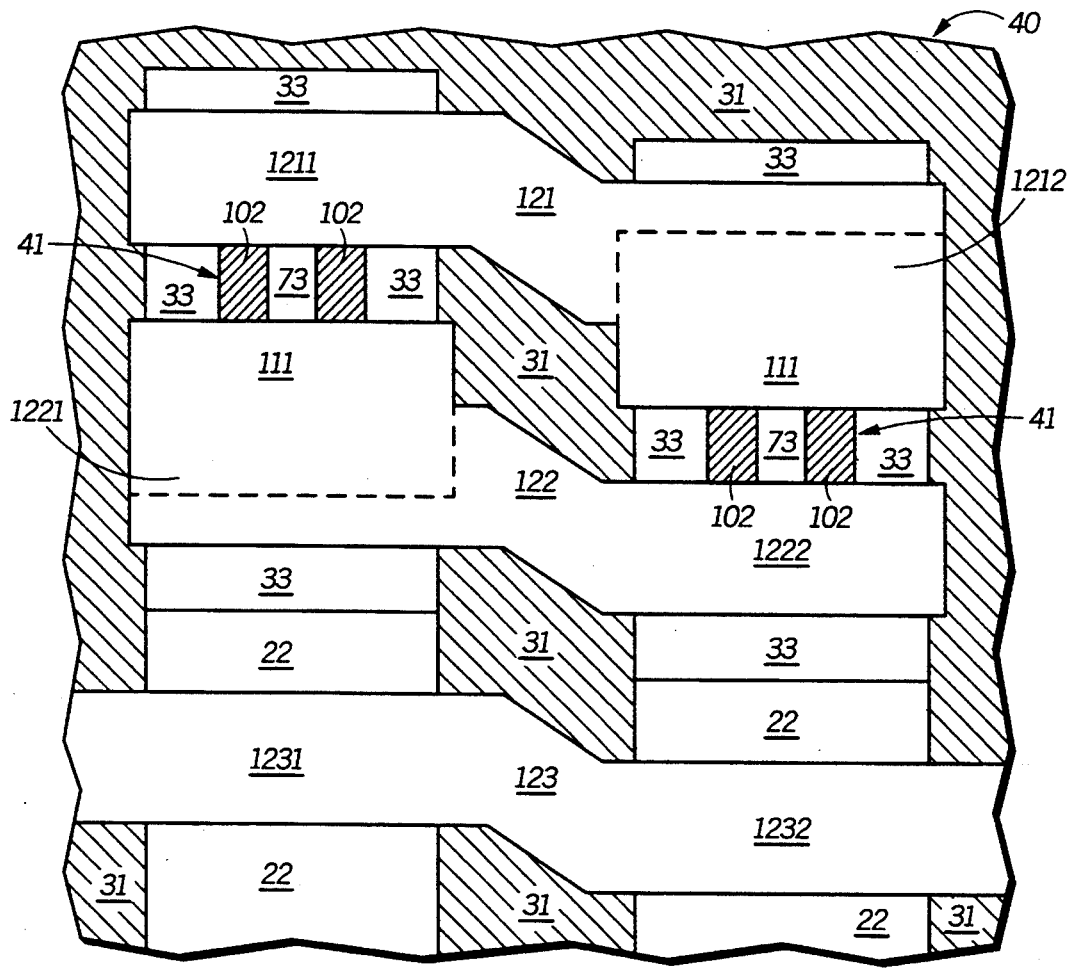
FIG. 13 includes a top view of the substrate of FIG. 12 after patterning the first and second conductive layers.

The conductive stack that includes conductive layers 82 and 111 is patterned to form conductive members 121-123 as shown in FIG. 13, which includes a top view of the memory cell 40 at this point in the process. Each of members 121 and 122 includes a portion that acts as a gate electrode, a portion that acts as an interconnect, and a portion that acts as a contact. Member 123 includes portions that act as a gate electrodes and a portion that acts as an interconnect.

Member 121 includes the first and second conductive layers 82 and 111. Gate electrode section 1211 of member 121 includes the first and second conductive layers 82 and 111, of which a portion of the first conductive layer 82 lies within the trench 41 near the left-hand side of FIG. 13. That portion of the first conductive layer 82 acts as a shared-gate electrode for an N-channel latch transistor and a P-channel load transistor. That portion also laterally surrounds region 73 and is itself surrounded by region 33, and part of that portion is covered by the insulating plug 102.

Contact section 1212 of member 121 includes the second conductive layer 111 but not the first conductive layer 82 and is indicated by the dashed lines within member 121. The contact section 1212 forms an electrical contact to regions 33 and 73 of the trench 41 near the right-hand side of FIG. 13. Regions 33 and 73 act as drain regions for latch and load transistors, respectively. The portion of member 121 that lies between the sections 1211 and 1212 acts as a local interconnect between the two sections.

Member 122 is similar to member 121, but has a gate electrode section 1222, part of which lies within the trench 41 near the right-hand side of FIG. 13, and a contact section 1222 that contacts regions 33 and 73 of the trench 41 near the left-hand side of FIG. 13. The combinations of the transistors formed along and within the trenches 41 and members 121 and 122 form a pair of inverters that are cross coupled, wherein the members 121 and 122 act as cross coupling elements. The cross-coupled inverters act as part of a storage element for the memory cell 40.

Member 123 acts as the word line for the memory cell 40 and includes the conductive layers 82 and 111 and is insulated from the p-type epitaxial layer 22 by gate dielectric layer 81. Member 123 has gate electrode sections 1231 and 1232 that act as gate electrodes for the access transistors that are used for reading and writing into the storage element.

Figure 14:
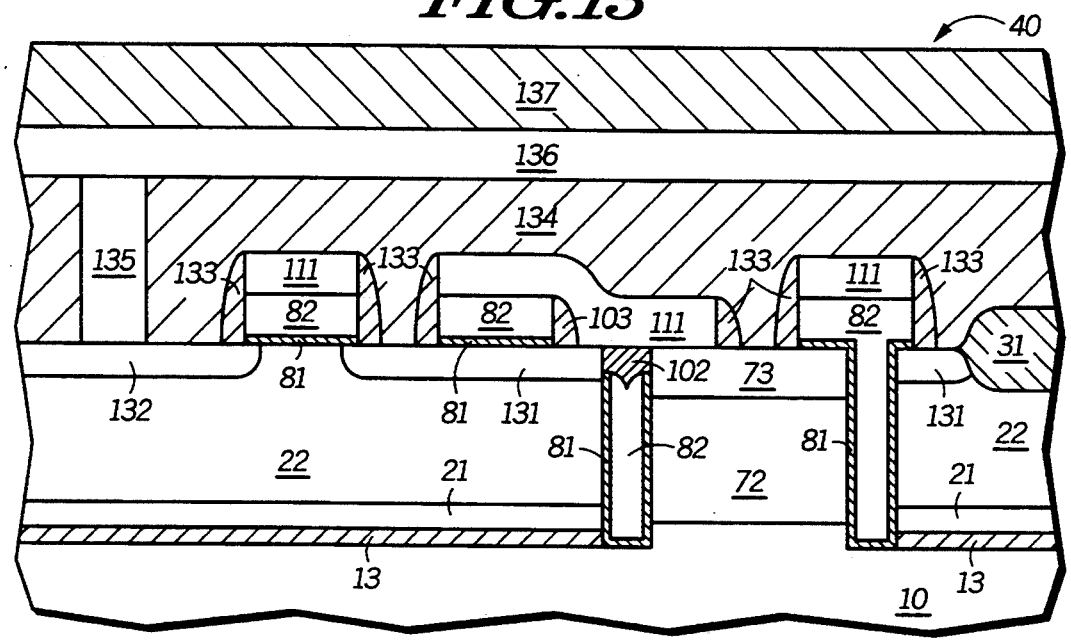
FIG. 14 includes a cross-sectional view of the substrate of FIG. 13 after forming a substantially completed device.

FIG. 14 includes a cross-sectional view of a substantially completed SRAM memory cell 40. After the formation of conductive members 121-123, sidewall spacers 133 are formed by depositing a silicon dioxide layer about 1000 angstroms thick followed by anisotropic etching. Then, an N+ ion implanting step is performed using arsenic to a dose of at least 1E15 atoms per square centimeter to form N+ doped regions 131 and 132. Regions 131 and 132 act as source/drain regions for the access transistors and/or drain regions for the latch transistors. Regions 131 are the combination of previously formed regions 33 and portions of the p-type epitaxial layer 22 that are doped in accordance to the step previously described in this paragraph. Regions 132 include dopants ion implanted after forming the members 121-123, but not n-type dopants introduced into the substrate prior to forming the members 121-123. Regions 73 are masked during the ion implanting step to reduce the risk of counter doping those regions.

Continuing with FIG. 14, an insulating layer 134 is then formed, and a contact opening 135 is formed in this insulating layer. Contact opening 135 is filled with a conductive material, such as tungsten or the like, and interconnects 136 are formed. A passivating layer 137 is formed over the interconnects 136. Additional insulating layers, vias, and levels of interconnects may be added if needed using conventional techniques.

Electrical connections are made to the memory cell 40. Interconnect 136 (shown in FIG. 14) is part of one bit line, and another interconnect similar to the one shown in FIG. 14 forms part of a complementary bit line. N+ doped region 21 acts as the source regions for the latch transistors and is electrically connected to other memory cells within the same memory array. N+ doped region 21 is electrically connected to a $V_{SS}$ electrode (not shown) that is typically at about ground potential when the memory cell is operating. The substrate 10 acts as source regions for the load transistors and is electrically connected to other memory cells within the same memory array. Substrate 10 is electrically connected to a VDD electrode (not shown) that is typically at a potential in a range of 0.9–5.0 volts when the memory cell 40 is operating.

Benefits

Many benefits are seen with the previously described embodiment of the current invention. Unlike a prior art SRAM memory cell, the presence of the buried oxide layer 13 in SRAM cell 40 prevents the formation of npnp structures that are prone to latch-up. A second benefit is the relative simplicity of the process used to fabricate the SRAM cell 40. The finished memory cell 40 has only a single composite layer for gate electrodes and local interconnects between the gate electrodes for the SRAM cell 40. That single composite layer includes the first and second conductive layers 82 and 111 that may each include a layer of silicon or silicide. Members 121–123 are formed from the single composite conductive layer. Many conventional SRAM cells may include anywhere from two-six conductive layers of silicon (without a silicide) or polycide.

Another benefit seen with the previously described embodiment of the current invention is the relative compactness of the SRAM cell 40. Because four of the six active transistors are vertical field-effect transistors, the lateral dimensions of the SRAM cell 40 (as measured from a top view of the cell 40) are reduced compared to an SRAM cell with lateral field-effect transistors in which the flow of electrons or holes is primarily in a lateral direction (parallel to the primary surface of the substrate). Still another benefit is an increased storage capacitance which is obtained within the memory cell 40. As memory cells are scaled to smaller dimensions, the reduced sizes of the memory cell elements lead to smaller values of stored charge within that cell, which makes the memory cell more susceptible to soft errors caused by subatomic particles. Because of the trench nature of the memory cell 40, charge is stored along the walls of the trenches 41 in this embodiment, leading to a higher value of stored charge as compared to a memory cell composed entirely of lateral field-effect transistors.

Options

There are several alternative options which can be used to build an SRAM cell in accordance with the present invention. The first option relates to the material used to construct the central region of the trench 72. Instead of using selectively grown epitaxial silicon, this region could be deposited using non-selectively deposited polysilicon or amorphous silicon. After deposition, the polysilicon or amorphous silicon is etched back to form a central pillar as shown in FIG. 8. In this embodiment the P-channel MOS device in the interior of the trench is a thin-film metal-oxide-semiconductor field-effect transistor (MOSFET), rather than a monocrystalline MOSFET. However, such MOSFETs are adequate for use as load transistors in SRAM memory cell 40.

A second alternative embodiment again is related to the formation of the central region of the trench 41. When using epitaxial silicon to form this central region, the epitaxial region could be deposited thicker than desired, then planarized using a technique such as chemical-mechanical polishing (CMP) to reduce the film to the desired thickness. In the finished memory cell 40, the film includes the n-type epitaxial layer 72 with a P+ doped region 73 formed within that layer 72. The use of this process would alleviate any problems caused by crystal facets that may form when using a selective epitaxial growth processing step.

An alternative embodiment involves the formation of the trenches 41. As discussed earlier, the storage of charge along the walls of the trenches 41 makes the memory cell less susceptible to soft errors caused by subatomic particles. If additional stored charge is desired, the trench depth could be extended past the buried oxide to extend to a significant depth into the substrate 10. As much stored charge as is needed can be obtained by simply deepening the trench depth to the desired value. The trenches may extend into the substrate in a range of 0.2–5.0 microns.

Many specific thicknesses, material, process parameters, and the like have been presented above. In other embodiments, many of these parameters may be changed. Conductivity types of the various layers or regions may be reversed. The buried oxide layer 13 may have a thickness in a range of 1000–5,000 angstroms, and the N+ doped region 21 may have a thickness in a range of 5000–10,000 angstroms.

The channel length of the latch transistors is a function of the thickness of the p-type epitaxial layer 22. The thickness of the p-type epitaxial layer 21 may be adjusted to change the channel length of the latch transistors. Typically the p-type epitaxial layer 21 has a thickness in a range of 2000–15,000 angstroms. The threshold voltage of the latch transistors is a function of the doping concentration of the p-type epitaxial layer 22. Typically, the concentration is in a range of the layer 22 is in a range of 1E15 to 1E18 atoms per cubic centimeter.

The N+ doped region 33 has a depth in a range of 1000–5000 angstroms. Silicon dioxide layer 32 has a thickness in a range of about 50–1000 angstroms, silicon nitride layer 34 may have a thickness in a range of 2000–6000 angstroms. As previously mentioned, the depth of the trenches may be changed. In some embodiments, the trenches may extend 1000–10,000 angstroms into the substrate 10. The silicon dioxide layer used to form the spacers 71 is typically formed to a thickness in a range of about 500–5000 angstroms. The channel length of the load transistors is a function of the thickness of the n-type epitaxial layer 72, diffusion of the p-type dopant from the substrate 10 into the layer 72 and the depth of the P+ doped region 73. The n-type epitaxial layer usually has a dopant concentration in a range of about 1E15 to 5E17 atoms per cubic centimeter. The P+ doped region 73 has a depth in a range of 1000–5000 angstroms and may be implanted with a dose higher than 1E15 ions per square centimeter.

The gate dielectric layer may include silicon dioxide, silicon nitride or a nitrided silicon dioxide layer and has a thickness in a range of about 50–500 angstroms. The first conductive layer 82 may be recessed within the trenches 41 in a range of 500–3000 angstroms. The thickness of the insulating layer used to form the insulating plugs 102 should be at least half as thick as the layer used to form the spacers 71 to ensure than the plug fills the opening that was formed by recessing the first conductive layer 82. The thickness of the insulating layer used to form the insulating plugs 102 is typically no greater than 3000 angstroms.

Many materials may be substituted for those specified within the embodiment previously described. The substrate 10 may include silicon, germanium, a silicon-germanium compound, or III–V semiconductors. P-type dopants include boron or the like, and n-type dopants include phosphorus, arsenic, antimony or the like. In many instances, one n-type dopant may be used instead of another. For example, the conductive layer 82 may include either phosphorus or arsenic doped polysilicon.

Silicon-containing materials may also be etched using bromine-based etch chemistries. Insulating layers may include silicon dioxide, silicon nitride, or silicon oxynitride. Conductive layers or regions may include heavily-doped silicon, metals, or metal-containing compounds. "Heavily-doped," "P+ doped", or "N+ doped" is an adjective for a layer or region having a doping concentration of at least 1E19 atoms per cubic centimeter. "Lightly-doped" is an adjective for a region or layer having a doping concentration of no more than 1E18 atoms per cubic centimeter.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A process for forming a static-random-access memory cell comprising the steps of:
   providing a substrate including:
      a semiconductor base material having a first conductivity type;
      a buried oxide layer overlying the semiconductor base material;
      a first doped region overlying the buried oxide layer, wherein the first doped region has a second conductivity type that is opposite the first conductivity type; and
      a first semiconductor layer overlying the first doped region and having the first conductivity type;
   forming a second doped region, wherein the second doped region:
      has the second conductivity type; and
      lies within the first semiconductor layer;
   forming a first trench extending through the buried oxide layer, first doped region, first semiconductor layer, and second doped region, wherein:
      the first trench has a wall surface, a bottom surface, and a central region; and
      a channel region of a first transistor lies within the first semiconductor layer adjacent to the wall surface of the first trench;
   forming a second semiconductor layer overlying the semiconductor base material within the central region of the first trench, wherein:
      the second semiconductor layer has the second conductivity type;
      the second semiconductor layer has a wall surface that faces the wall surface of the first trench; and
      a channel region of a second transistor lies within the second semiconductor layer and adjacent to the wall surface of the second semiconductor layer;
   forming a third doped region lying within the second semiconductor layer and having the first conductivity type;
   forming a first gate dielectric layer lying adjacent to the wall surface of the first trench and second semiconductor layer and adjacent to the bottom surface of the first trench outside of the central region of the first trench; and
   forming a first conductive member, wherein the first conductive member:
      lies at least partially within the first trench and adjacent to the first gate dielectric layer;
      laterally surrounds the second semiconductor layer; and
      acts as a shared-gate electrode for the first and second transistors.

2. The process of claim 1, further comprising steps of:
   electrically connecting the semiconductor base material to a $V_{DD}$ electrode; and
   electrically connecting the first doped region to a $V_{SS}$ electrode.

3. The process of claim 1, wherein the step of forming second semiconductor layer includes epitaxially growing silicon.

4. The process of claim 1, wherein:
   the step of forming the second doped region also forms a fourth doped region, wherein the second and fourth doped regions:
      have the second conductivity type;
      lie within the first semiconductor layer; and
      are spaced apart from each other;
   the step of forming the first trench also forms a second trench, wherein:
      the second trench extends through the buried oxide layer, first doped region, first semiconductor layer and the fourth doped region;
      the second trench has a wall surface, a bottom surface, and a central region; and
      a channel region of a third transistor lies within the first semiconductor layer adjacent to the wall surface of the second trench;
   the step of forming the second semiconductor layer includes forming a portion of the second semiconductor layer overlying the semiconductor base material within the central region of the second trench, wherein:
      the portion of second semiconductor layer has the second conductivity type;
      the portion of the second semiconductor layer has a wall surface that faces the wall surface of the second trench; and
      a channel region of a fourth transistor lies within the second semiconductor layer adjacent to the wall surface of the second trench;
   the step of forming a third doped region also forms a fifth doped region lying within the portion of the second semiconductor layer that lies within the second trench and having the first conductivity type;
   the step of forming a first gate dielectric layer also forms a second gate dielectric layer, wherein the second gate dielectric layer lies adjacent to the wall surface of the second trench and the portion of the second semiconductor layer within the second trench and adjacent to the bottom surface of the second trench outside of the central region of the second trench;

the step of forming the first conductive member also forms a second conductive member, wherein:

the second conductive member lies at least partially within the second trench and adjacent to the second gate dielectric layer;

the second conductive member has laterally surrounds the portion of the second semiconductor layer lying within the second trench; and the second conductive member acts as a shared-gate electrode for a third transistor and a fourth transistor; and the process further comprises steps of:

forming a sixth doped region and a seventh doped region, wherein the sixth and seventh doped regions;

have the second conductivity type;

lie within the first semiconductor layer; and are spaced apart from each other and the second and fourth doped regions; and forming at least one third conductive member, wherein the at least one third conductive member:

overlies portions of the second, fourth, sixth, and seventh doped regions, a portion of the first semiconductor layer that lies between the second and sixth doped regions, and another portion of the first semiconductor layer that lies between the fourth and seventh doped regions; and acts as gate electrodes for access transistors.

5. The process of claim 4, wherein the step of forming second semiconductor layer includes epitaxially growing silicon.

6. The process of claim 1, wherein the step of forming the second semiconductor layer is performed by depositing a material selected from a group consisting of polysilicon and amorphous silicon.

7. The process of claim 1, further comprising steps of:

forming a spacer adjacent to the wall surface of the first trench prior to the step of forming the second semiconductor layer; and removing the spacer after the step of forming the second semiconductor layer.

8. The process of claim 7, wherein the spacer includes oxide.

9. A process for forming a static-random access memory cell comprising the steps of:

providing a semiconductor substrate including:

a semiconductor base material having a first conductivity type;

a buried oxide layer overlying the semiconductor base material;

a first doped region overlying the buried oxide layer, wherein the first doped region has a second conductivity type that is opposite the first conductivity type; and a first semiconductor layer overlying the first doped region and having the first conductivity type;

forming a second doped region and a third doped region, wherein the second and third doped regions:

have the second conductivity type;

lie within the first semiconductor layer; and are spaced apart from each other;

forming a first trench and a second trench wherein:

the first trench extends through the buried oxide layer, first doped region, first semiconductor layer, and the third doped region;

the second trench extends through the buried oxide layer, first doped region, first semiconductor layer, and the second doped region;

each of the first and second trenches has a wall surface, a bottom surface, and a central region;

a channel region of a first latch transistor lies within the first semiconductor layer adjacent to the wall surface of the first trench; and a channel region of a second latch transistor lies within the first semiconductor layer adjacent to the wall surface of the second trench;

forming a second semiconductor layer overlying the semiconductor material, wherein:

a first portion of the second semiconductor layer is formed within the central region of the first trench and has a wall surface that faces the wall surface of the first trench;

a second portion of the second semiconductor layer is formed within the central region of the second trench and has a wall surface that faces the wall surface of the second trench;

the second semiconductor layer has the second conductivity type;

a channel region of a first load transistor lies adjacent to the wall surface of the first portion; and a channel region of a second load transistor lies adjacent to the wall surface of the second portion;

forming a fourth doped region and a fifth doped region, wherein:

the fourth doped region lies within the first portion of the second semiconductor layer;

the fifth doped region lies within the second portion of the second semiconductor layer; and the fourth and fifth doped regions have the first conductivity type;

forming a first gate dielectric layer and a second gate dielectric layer, wherein:

the first gate dielectric layer lies adjacent to the wall surfaces of the first trench and the first portion of the second semiconductor layer and adjacent to the bottom surface of the first trench outside of the central region of the first trench; and the second gate dielectric layer lies adjacent to the wall surfaces of the second trench and the second portion of the second semiconductor layer and adjacent to the bottom surface of the second trench outside of the central region of the second trench;

forming a first conductive member and a second conductive member, wherein:

the first conductive member:

lies at least partially within the first trench and adjacent to the first gate dielectric layer;

laterally surrounds the first portion of the second semiconductor layer; and acts as a shared-gate electrode for the first latch and first load transistors; and the second conductive member:

lies at least partially within the second trench and adjacent to the second gate dielectric layer;

laterally surrounds the second portion of the second semiconductor layer; and acts as a shared-gate electrode for the second latch and second load transistors;

forming a sixth doped region and a seventh doped region, wherein the sixth and seventh doped regions;
- have the second conductivity type;
- lie within the first semiconductor layer; and
- are spaced apart from each other and the second and third doped regions; and forming at least one third conductive member, wherein the at least one third conductive member:
- overlies portions of the second, third, sixth, and seventh doped regions, a portion of the first semiconductor layer that lies between the second and sixth doped regions, and another portion of the first semiconductor layer that lies between the third and seventh doped regions; and
- acts as gate electrodes for access transistors.

10. The process of claim 9, wherein the step of forming second semiconductor layer includes epitaxially growing silicon.

11. The process of claim 9, further comprising steps of:
electrically connecting the semiconductor base material to a $V_{DD}$ electrode; and
electrically connecting the first doped region to a $V_{SS}$ electrode;
electrically connecting the sixth doped region to a first bit line; and
electrically connecting the seventh doped region to a second bit line.

12. The process of claim 9, wherein:
the step of providing includes the semiconductor base material having a p-type dopant concentration in a range of 1E17 to 1E18 atoms per cubic centimeter, the first doped region having an n-type dopant concentration of at least 1E19 atoms per cubic centimeter, and the first semiconductor layer has a p-type dopant concentration no higher than 1E17 atoms per cubic centimeter;
the steps of forming the second, third, sixth, and seventh doped regions each include doping portions of the first semiconductor layer with an n-type dopant to a dopant concentration of at least 1E19 atoms per cubic centimeter;
the step of forming the second semiconductor layer forms a silicon layer having an n-type dopant concentration no higher than 1E17 atoms per cubic centimeter; and
the step of forming the fourth and fifth doped regions are formed by doping part of the first and second portions, respectively, of the second semiconductor layer with a p-type dopant to a dopant concentration of at least 1E19 atoms per cubic centimeter.

13. The process of claim 9, wherein the step of forming the second semiconductor layer is performed by depositing a material selected from a group consisting of polysilicon and amorphous silicon.

14. The process of claim 9, further comprising steps of:
forming spacers adjacent to the wall surfaces of the first and second trenches prior to the step of forming the second semiconductor layer; and
removing the spacers after the step of forming the second semiconductor layer.

15. The process of claim 14, wherein the spacers include oxide.

* * * * *